(12) United States Patent
Fujita (10) Patent No.: US 6,212,118 B1
(45) Date of Patent: *Apr. 3, 2001

(54) SEMICONDUCTOR MEMORY (75) Inventor: Mamoru Fujita, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/211,589

(22) Filed: Dec. 14, 1998

(30) Foreign Application Priority Data

Dec. 12, 1997 (JP) .................................................. 9-342834

(51) Int. Cl.[7] ............................................... G11C 7/00
(52) U.S. Cl. .................... 365/222; 365/200; 365/230.03
(58) Field of Search ................................. 365/200, 222, 365/230.03

(56) References Cited

U.S. PATENT DOCUMENTS

| 5,157,628 | 10/1992 | Tani ........................................ 365/200 |
| 5,265,055 | * 11/1993 | Horiguchi et al. ................... 365/200 |
| 5,617,365 | * 4/1997 | Horiguchi et al. ................... 365/200 |
| 5,815,448 | * 9/1998 | Horiguchi et al. ................... 365/200 |
| 5,966,336 | * 10/1999 | Horiguchi et al. ................... 365/200 |

FOREIGN PATENT DOCUMENTS

| 3-104096 | 5/1991 | (JP) . |
| 5-29582 | 2/1992 | (JP) . |
| 5-258591 | 10/1993 | (JP) . |

* cited by examiner

*Primary Examiner*—Richard Elms
*Assistant Examiner*—Vanthu Nguyen

(57) ABSTRACT

A semiconductor memory includes a plurality of memory cell arrays each composed of a plurality of memory cells, each of the memory cell arrays including a plurality of main word lines, each of which is composed of a pair of sub-word lines each connected to a plurality of memory cells, means for driving the main word lines, power supply voltage supply line driving means connected to the sub-line lines. When a redundant word line used in place of a specific sub-word line including a defective sense amplifier is activated, the number of the sub-word lines activated when a data input/output is conducted is different from the number of sub-word lines activated in a refreshing operation. When the data input/output is conducted, a replacement of a sub-word line is executed on the basis of the result of a comparison between an externally supplied row address and an internally stored row address. When the refreshing operation is conducted, the replacement of the sub-word line is executed on the basis of an output of an internal refresh address counter and simultaneously with an ordinary refreshing operation.

16 Claims, 6 Drawing Sheets

PRIOR ART

SEMICONDUCTOR MEMORY

BACKGROUND OF THE INVENTION

1. Field of the Invention

The present invention relates to a semiconductor memory, and more specifically to a rewriting operation of a memory cell and a relieving operation of a defective memory cell in a semiconductor memory.

2. Description of Related Art

Many proposals have been made in a technology in which, when a defective memory cell is found out in a semiconductor memory, a suitable redundant memory cell is efficiently selected in place of the defective memory cell, and information to be stored in the defective memory cell is actually stored in the selected redundant memory cell, in order to avoid the above mentioned defect and to elevate the yield of production in the semiconductor memory.

For example, Japanese Patent Application Pre-examination Publication No. JP-A-03-104096 (an English abstract of JP-A-03-104096 is available from the Japanese Patent Office and the content of the English abstract of JP-A-03-104096 is incorporated by reference in its entirety into this application) proposes a semiconductor memory configured to prevent a plurality of output bits from failing simultaneously in order to elevate a bit relieving effect in a redundancy operation thereby to elevate reliability of the semiconductor memory. For this purpose, in a semiconductor memory of a m-bit input/output construction having a plurality of cell array columns, a plurality of sense amplifier columns, a row selection circuit provided for the plurality of sense amplifier columns, and a column selection circuit provided in common to the plurality of sense amplifier columns, the sense amplifier columns and cell array columns are divided into "m" groups in each of which a redundant sense amplifier and a redundant cell array are provided, and simultaneously, the column selection circuit is divided into "m" groups in each of which a redundant column selection circuit is provided.

Japanese Patent Application Pre-examination Publication No. JP-A-05-258591 (an English abstract of JP-A-05-258591 is available from the Japanese Patent Office and the content of the English abstract of JP-A-05-258591 is incorporated by reference in its entirety into this application) proposes a defective relieving method in which a redundant word line and an address comparing circuit/redundant decoder circuit are provided for each memory cell array block, and an address of a word line connected to a defective memory cell is programmed in an address comparing circuit provided in any memory cell block other than the memory cell array block including the defective memory cell, so that a defective word line is replaced by a redundant word line of the memory cell array block including the address comparing circuit thus programmed.

However, in technologies developed in this field of art including the above mentioned technologies, since it is a fundamental practice to select one word line, when an active operation such as a reading and a writing is executed, and when a rewriting operation called a refreshing is executed in a memory needing the refreshing, it is not possible to efficiently select a redundant circuit. With increase of memory cell arrays, since the number of word lines connected to the column selection line is increased, a load capacitance of the column selection line becomes large, resulting in an increased consumed current and in a lowered processing speed.

Here, a semiconductor memory capable of efficiently switch to a redundant circuit for a short time, is desired.

Figure 4:
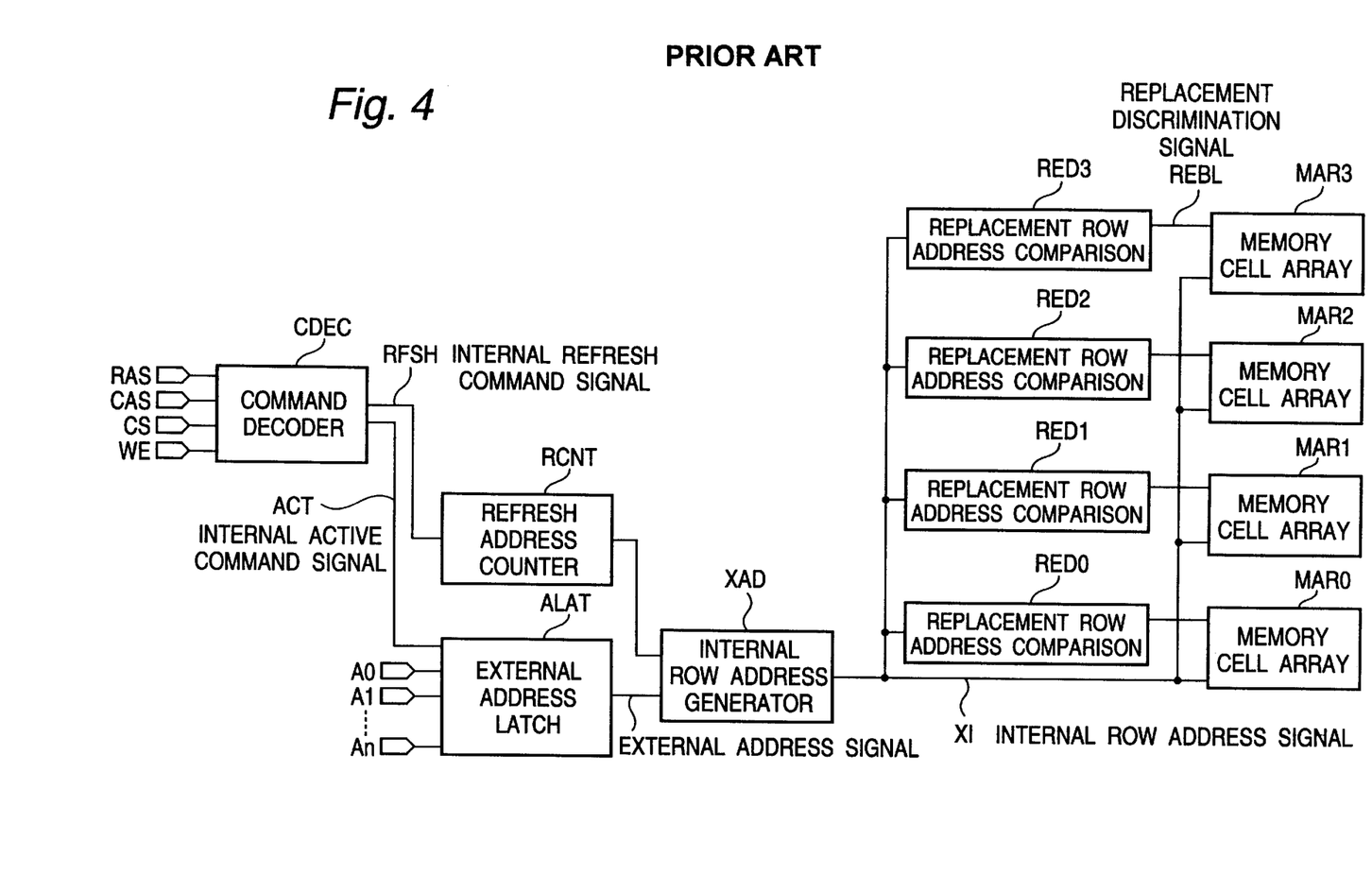
FIG. 4 is a block diagram illustrating one example of the above mentioned prior art synchronous DRAM.
Figure 5:
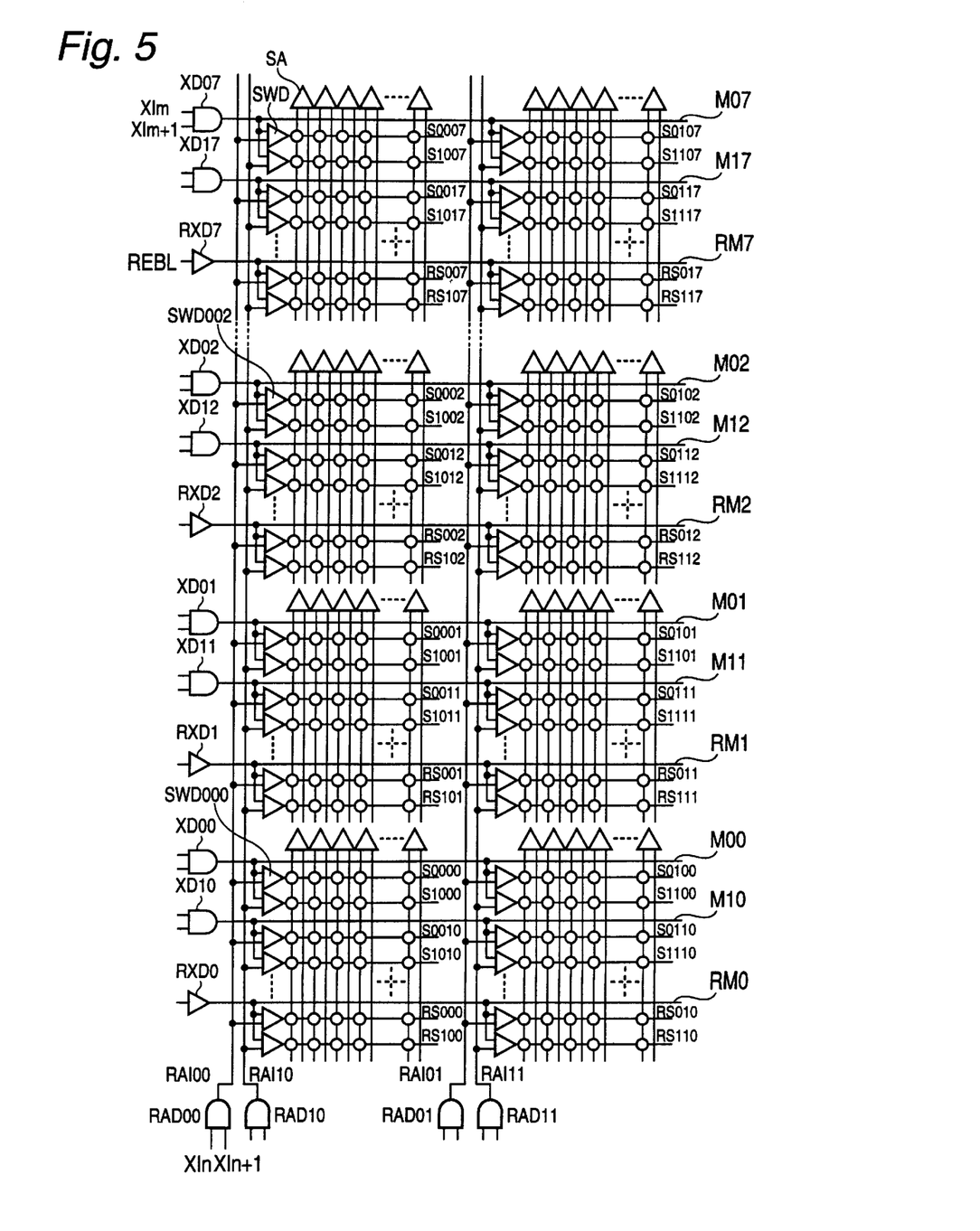
FIG. 5 is a block diagram illustrating the construction of the memory cell arrays MAR0 to MAR 3 shown in FIG. 4.

One example of the semiconductor memory is a synchronous DRAM having a construction as shown in FIGS. 4 and 5.

As shown in FIGS. 4 and 5, the semiconductor memory includes a plurality of memory cell arrays (for example, MAR0 to MAR3), each of which includes a main word line and two sub-word lines associated thereto, a plurality of memory cells connected to each of the sub-word lines being connected to the same bit line of the same sense amplifier in the same sub-word line set, and being alternately connected to the other bit line of the same sense amplifier in an adjacent other sub-word line set.

Now, a detailed construction of the above mentioned semiconductor memory will be described with reference to FIGS. 4 to 7. FIG. 4 is a block diagram illustrating one example of the above mentioned prior art synchronous DRAM, and FIG. 5 is a block diagram illustrating the construction of the memory cell arrays MAR0 to MAR 3 shown in FIG. 4.

Figure 6:
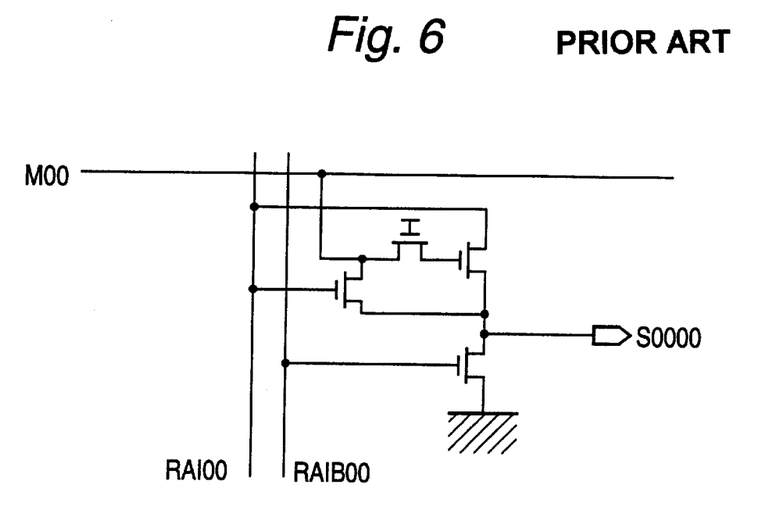
FIG. 6 is a circuit diagram illustrating one example of the sub-word line driver circuit SWD shown in FIG. 5.
Figure 7:
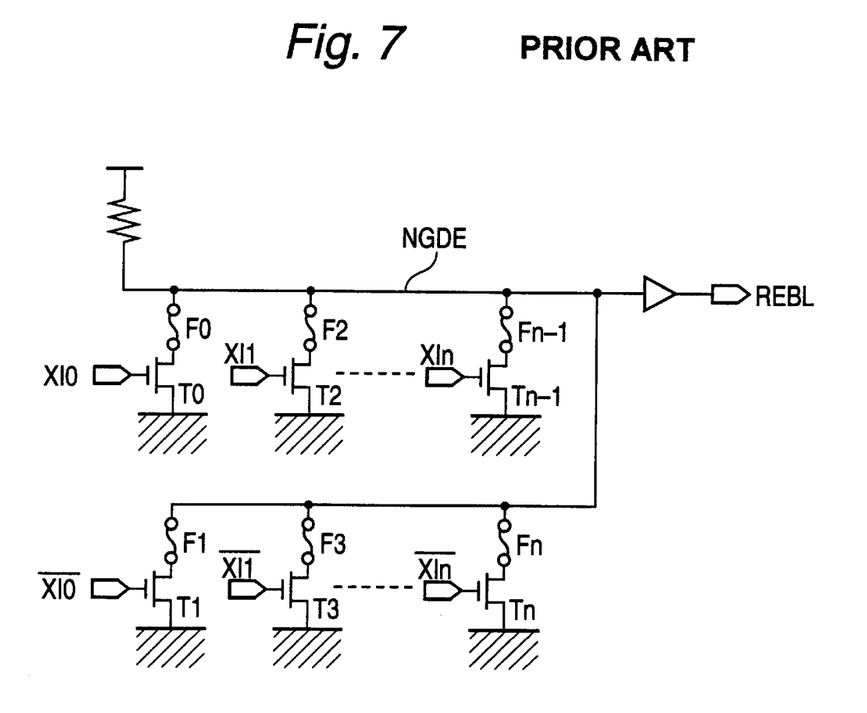
FIG. 7 is a circuit diagram illustrating one example of the replacement row address comparing circuit RED shown in FIG. 4.

In addition, FIG. 6 is a circuit diagram illustrating one example of the sub-word line driver circuit SWD shown in FIG. 5, and FIG. 7 is a circuit diagram illustrating one example of the replacement row address comparing circuit RED shown in FIG. 4. Incidentally, in the following description, for convenience of description it is assumed that the shown synchronous DRAM comprises four memory cell arrays, and the number of memory cells activated when a refresh command is inputted is four times the number of memory cells activated when an active command is inputted.

Furthermore, it is also assumed that when the refresh command is inputted, the main word lines M00 to M17 in all the memory cell arrays MAR0 to MAR3 are individually activated one by one. In FIG. 4, each of the memory cell arrays MAR0 to MAR3 includes a plurality of memory cells, and the memory cell arrays MAR0 to MAR3 operate independently of each other.

In the following, the construction of each memory cell array will be described. In FIG. 5, Reference Signs XD00 to XD17 designate main word line decoders, each of which is selected by a portion of an internal row address signal XI so as to drive a corresponding main word line M00 to M17.

Reference Signs RAD00 to RAD11 designate power supply line driving circuits, each of which is also selected by a portion of the internal row address signal XI so as to supply a power supply voltage to a power supply voltage supplying line RAI00 to RAI11.

On the other hand, Reference Sign SWD designates sub-word line driving circuits, each of which connected to a corresponding main word line M00 to M17 and a corresponding power supply voltage supplying line RAI00 to RAI11. When the corresponding main word line and the corresponding power supply voltage supplying line are selected, the sub-word line driving circuit SWD drives an associated sub-word line S0000 to S1007, and when at least one of the corresponding main word line and the corresponding power supply voltage supplying line is not selected, the sub-word line driving circuit SWD deactivates the associated sub-word line. Furthermore, Reference Sign RSWD designates redundant sub-word line driving circuits, each of which connected to a corresponding redundant main word line RXD0 to RXD7 and a corresponding power supply voltage supplying line RAI00 to RAI11. When the corresponding redundant main word line and the corresponding power supply voltage supplying line are selected, the redundant sub-word line driving circuit RSWD drives an associated redundant sub-word line RS00 to RS17, and when at least one of the corresponding redundant main word line and the corresponding power supply voltage supplying line is not selected, the redundant sub-word line driving circuit RSWD deactivates the associated redundant sub-word line.

Referring to FIG. 6 which is a circuit diagram illustrating one example of the sub-word line driver circuit SWD shown in FIG. 5, the main word line M00 is connected to a source of each of first and second transistors. The first transistor having the source connected to the main word line M00, has a gate connected to the power supply voltage supplying line RAI00, and a drain connected to a drain of a third transistor having a gate connected to another power supply voltage supplying line RAIB00 and a source connected to ground. The second transistor having the source connected to the main word line M00, has a gate to a high potential and a drain connected to a gate of a fourth transistor having a source connected to the power supply voltage supplying line RAI00 and a drain connected to the drain of the first transistor and the drain of the third transistor. The connection node between the third and fourth transistor is connected to a corresponding sub-word line S0000. The sub-word line driving circuits SWD are driven with the same power supply voltage supplying lines in common. Therefore, the main word line is connected to the sub-word line driving circuits SWD of the number corresponding to the column number of the sub-word line driving circuits SWD, and on the other hand, the power supply voltage supplying line RAI00 is connected to all the sub-word line driving circuits SWD included in each column of the sub-word line driving circuits SWD. Incidentally, "RAIB" indicates a signal complementary to the signal of the power supply voltage supplying line RAI, and is generated in the power supply voltage supplying line driving circuit RAD, but is omitted in FIG. 5 for simplification of the drawing.

The redundant sub-word line driving circuits SWD has the same construction as that of the sub-word line driving circuits SWD, excepting that the main word line M00 to M17 is replaced with the redundant main word line RXD0 to RXD7, and the sub-word line S0000 to S1007 is replaced with the redundant sub-word line RS00 to RS17. The power supply voltage supplying line RAI is used in common to the sub-word line driving circuits SWD.

The sub-word lines and the redundant sub-word lines are connected to corresponding memory cells, of memory cells which are denoted by small circles located in the form of a matrix in FIG. 5. When the sub-word line and the redundant sub-word line are activated, the memory cell is connected to a corresponding bit line, so that data is inputted or outputted through a sense amplifier.

In FIG. 4, a command decoder CDEC receives various command signals RAS, CAS, CS and WE supplied from an external, and generates, on the basis of the combination of the external command signals, internal command signals for determining an internal operation. Of the internal command signals, only an internal active command signal ACT and an internal refresh command signal RFSH, which relate to the present invention, are shown in FIG. 4.

The active command is a command for selecting and activating the sub-word line in order to input data into a memory cell from an external or in order to output data in the memory cell to the external. The refresh command is a command for rewriting the data of the memory cell.

In response to the internal active command signal ACT, an external address latch circuit ALAT fetches address signals A0 to An supplied from the external. A refresh address counter RCNT is a counter for holding a row address to be refreshed next, and updates the value of the counter in response to the internal refresh command signal RFSH.

An internal row address generating circuit XAD generates an internal row address signal XI which is based on an output of the external address latch circuit ALAT when the active command is inputted, and on the value of the refresh address counter RCNT when the refresh command is inputted. The internal row address signal XI is constituted of a plurality of binary bits, which can be divided into a plurality of groups each consisting of the same arbitrary number of digits. In FIG. 5, when the internal row address signal XI is divided into individual bits, the individual bits are designated with XI0, XI1, . . . , XIn, . . . .

In the case that the four memory cell arrays are provided as in the shown example, the ratio of the number of cells activated by the refresh command to the number of cells activated by the active command is four. In this case, the number of bits of the internal row address made effective when the refresh command is inputted is smaller than, by two bits, the bit number of the internal row address made effective when the active command is inputted. These two bits are used to distinguish or select one memory cell array, of the memory cell arrays MAR0 to MAR3, to be activated when the active command is inputted Replacement row address comparing circuits RED0 to RE3 hold a row address of the sub-word line to be replaced with the redundant sub-word line, and compares the held row address with the internal row address signal.

FIG. 7 is a circuit diagram illustrating one example of the replacement row address comparing circuit RED. In FIG. 7, Reference Signs F0 to Fn designate two arrays of fuses, which can be cut off by a laser beam or other means.

In order to store the replacement row address, for example, either the fuse F0 or the fuse F1 is cut off. When the fuse F0 is cut the potential of a connection node NGDE does not change even if a bit XI0 of the internal row address signal is at a high level. However, when the internal address bit XI0 is at a low level, a transistor T1 is turned on in response to a complementary bit /XI0 of the bit XI0, so that the potential of the connection node NGDE is pulled down. This operation is executed for all the bits of the internal row address signal XI.

When the result of comparison made in this procedure does not indicate coincidence, a replacement discrimination signal REBL is inactivated, with the result that the main word line of the memory cell arrays MAR0 to MAR3 is activated on the basis of a portion of the internal row address signal XI. In addition, the power supply voltage supplying line RAI is selected on the basis of a portion of the internal row address signal XI.

On the other hand, when the result of comparison made in this procedure indicates coincidence, the replacement discrimination signal REBL is activated, with the result that the replacement is executed by activating the redundant main word line. The power supply voltage supplying line RAI is selected on the basis of the replacement discrimination signal REBL, and is not necessarily coincident with the selection on the basis of a portion of the internal row address signal XI when the replacement is not executed.

These operations are conducted in each of the memory cell arrays MAR0 to MAR3, independently of the other memory cell arrays. Accordingly, the memory cell arrays MAR0 to MAR3 can operate in parallel to each other.

Now, an operation will be described.

When the active command is inputted from the external, the internal active command signal ACT is generated, and the internal row address signal XI is generated on the basis of the address signals A0 to An supplied from the external.

Succeedingly, of the memory cell arrays MAR0 to MAR3, one memory cell array, for example, MAR0 is selected by the portion of the internal row address signal XI. The internal row address signal XI is also supplied to the replacement row address comparing circuits RED, and is compared with the replacement row address stored in the replacement row address comparing circuit RED.

If none of the replacement row address comparing circuits RED detects the coincidence, the main word line decoder designated by the portion of the internal row address signal, for example, XD00, is selected, so that the main word line M00 is driven.

Simultaneously, the power supply voltage supplying line driving circuits designated by the portion of the internal row address signal, for example, RAD00 and RAD01, are selected, so that the power supply voltage supplying lines RAI00 and RAI01 are driven.

As a result, the sub-word line driving circuits SWD000 and SWD010 are selected, so that the sub-word lines S000 and S010 are activated.

However, as mentioned above, since the power supply voltage supplying line driving circuits RAD00 and RAD01 generate signals complementary to each other, only one of the sub-word lines S000 and S010 is selected.

On the other hand, when any one of the replacement row address comparing circuits RED detects the coincidence, the redundant main word line decoder designated by the replacement row address comparing circuits RED having detected the coincidence, for example, RXD0, is selected, so that the redundant main word line RM0 is driven.

Simultaneously, the power supply voltage supplying line driving circuit designated by the replacement row address comparing circuits RED having detected the coincidence, for example, RAD10 or RAD11, is selected, so that the power supply voltage supplying line RAI10 or RAI11 is driven.

As a result, the redundant sub-word line driving circuits RSWD10 and RSWD11 are selected, so that the redundant sub-word line RS000 or RS010 are activated.

Furthermore, when the refresh command RFSH is inputted, all the memory cell arrays are selected, so that in each of the memory cell arrays, the sub-word lines or the redundant sub-word line are activated in substantially the same procedure as that executed when the active command is inputted.

Since each of the memory cell arrays MAR0 to MAR 3 include replacement row address comparing circuits RED operating independently of each other, the defective memory cell replacement is executed independently. Therefore, the same replacement efficiency as that obtained when the active command is inputted, can be obtained.

In the above mentioned operation, when the refresh command is inputted, since the memory cell arrays independently operate in parallel to each other, a total amount of the charging/discharging current of the sub-word lines, the charging/discharging current of the power supply voltage supplying lines and the charging/discharging current of the main word lines, becomes four times that when the active command is inputted.

Of these charging/discharging currents, the charging/discharging current of the sub-word lines are a current required in order to activate the sub-word lines of the number which is four times the number of the sub-word lines activated when the active command is inputted. However, comparing the main word lines with the power supply voltage supplying lines, the source electrode of the sub-word line driving circuits of the number larger that of the main word lines are connected to the power supply voltage supplying lines, and therefore, an interconnection capacitance and a parasite capacitance remarkably becomes large. This is a cause for remarkably increasing the current consumption when the refresh command is inputted.

In the above explanation, the case that only one main word line in each of the memory cell arrays MAR0 to MAR3 is activated, has been described. However, in order to elevate the replacement efficiency, it is possible to active a plurality of main word lines in each of the memory cell arrays MAR0 to MAR3.

In this case, the number of the activated power supply voltage supplying lines is not increased, increased of the charging/discharging current of the power supply voltage supplying lines is suppressed. In addition, if all the main word lines to be activated are included in the same memory cell array, the charging/discharging current of the power supply voltage supplying lines is not increased. Therefore, this modification may be preferable.

However, in this case, a plurality of sub-word lines of the sub-word lines connected to one power supply voltage supplying line are activated. Therefore, when a defective memory cell exists, it becomes impossible to replace only a portion of the plurality of sub-word lines to be activated, with the redundant sub-word line connected to another power supply voltage supplying line. Therefore, the replacement efficiency drops, with the result that the yield of production lowers.

In brief, in the above mentioned prior art example, if the case is considered in which the four memory cell arrays are provided and only one sub-word line is selected to be activated in one reading operation, when the one sub-word line has been discriminated to be defective, it is possible to arbitrarily select one of eight redundant sub-word lines of the redundant circuits. However, in an example in which two sub-word lines are simultaneously selected to be activated, if one of the two sub-word lines has been discriminated to be defective, it is possible to arbitrarily select one of only the three redundant circuits. Therefore, the number of the sub-word lines allocated for one power supply voltage supply line and activated when the active command is inputted, and the number of the sub-word lines allocated for one power supply voltage supply line activated when the refresh command is inputted, are in a tradeoff relation between the current consumption and the yield of production.

In the synchronous DRAM, generally, the number of sense amplifiers activated when the data is inputted or outputted in response to the active command, is different from the number of sense amplifiers activated when the memory is refreshed in response to the refresh command. For example, in a 256 M-bit synchronous DRAM having a 8K refresh cycle and four banks, 4K sense amplifiers are activated with the active command, and 16K sense amplifiers are activated with the refresh command.

Accordingly, the number of the sub-word lines (a gate electrode of memory cell transistors) activated when the active command ACT is inputted, is different from the number of the sub-word lines activated when the refresh command RFSH is inputted. In the above mentioned 256 M-bit synchronous DRAM, accordingly, when the refresh command RFSH is inputted, the sub-word lines of the number which is four times the number of the sub-word lines activated when the active command ACT is inputted, are activated.

On the other hand, since the power supply voltage is supplied to the sub-word lines S000 to S1007 by means of the power supply voltage supplying line driving circuits RAI, the number of the sub-word lines activated by one RAI line is the same, the charging/discharging current of the RAI line becomes large, so that the current consumption of the whole of a chip increases.

In particular, in the DRAM, since it is an ordinary practice to use an internal step-up system which elevates the activating voltage for the sub-word lines S000 to S1007, to a level higher than an external power supply voltage. In addition, since the internal step-up system is required to be designed to fulfill with a maximum consumption current, the chip area is inevitably increased.

Under this circumstance, it can be considered to change the number of the sub-word lines included in the sub-word lines connected to the same RAI line and activated when the active command is inputted, and the number of the sub-word lines included in the sub-word lines connected to the same RAI line and activated when the refresh command is inputted. This is possible by changing the number of activated main word lines orthogonal to the RAI lines. However, if this approach is adopted, the sub-word lines included in the same memory cell array and simultaneously activated when the refresh command is inputted, are required to be connected to the same RAI line. Therefore, if one defective line is included on these sub-word lines, when the defective line is replaced with a redundant sub-word line previously provided in the memory cell arrays, it is necessary to replace the defective line with the redundant sub-word line connected to the same RAI line. Therefore, the number of the defective sub-word lines to be replaced with the redundant sub-word lines is limited, so that the yield of production in the chip lowers.

SUMMARY OF THE INVENTION

Accordingly, it is an object of the present invention to provide a semiconductor memory which has overcome the above mentioned defect of the conventional one.

Another object of the present invention is to provide a semiconductor memory having a reduced current consumption in the refresh operation, a reduced chip area, a high defective cell replacement efficiency and a high yield of production, and a method for driving the semiconductor memory.

The above and other objects of the present invention are achieved in accordance with the present invention by a semiconductor memory including a plurality of memory cell arrays each composed of a plurality of memory cells, each of the memory cell arrays including a plurality of main word lines, each of which is composed of a pair of sub-word lines each connected to a plurality of memory cells, means for driving the main word lines, power supply voltage supply line driving means connected to the sub-line lines, in which when a redundant word line used in place of a specific sub-word line including a defective sense amplifier is activated, the number of the sub-word lines activated when a data input/output is conducted is different from the number of sub-word lines activated in a refreshing operation, and wherein when the data input/output is conducted, a replacement of a sub-word line is executed on the basis of the result of a comparison between an externally supplied row address and an internally stored row address, and when the refreshing operation is conducted, the replacement of the sub-word line is executed on the basis of an output of an internal refresh address counter and simultaneously with an ordinary refreshing operation.

Since the semiconductor memory in accordance with the present invention has the above mentioned construction, when the data input/output is conducted, a discrimination signal is generated on the basis of the comparison between the externally supplied row address and the internally stored row address, and a redundant word line is driven on the basis of the discrimination signal. In the refresh operation, the sub-word line is driven on the basis of the output of an internal refresh row address counter.

The above and other objects, features and advantages of the present invention will be apparent from the following description of preferred embodiments of the invention with reference to the accompanying drawings.

DESCRIPTION OF THE PREFERRED EMBODIMENTS

Now, embodiments of the semiconductor memory and the semiconductor memory driving method in accordance with the present invention will be described with reference to the accompanying drawings.

Figures 1A, 1B:
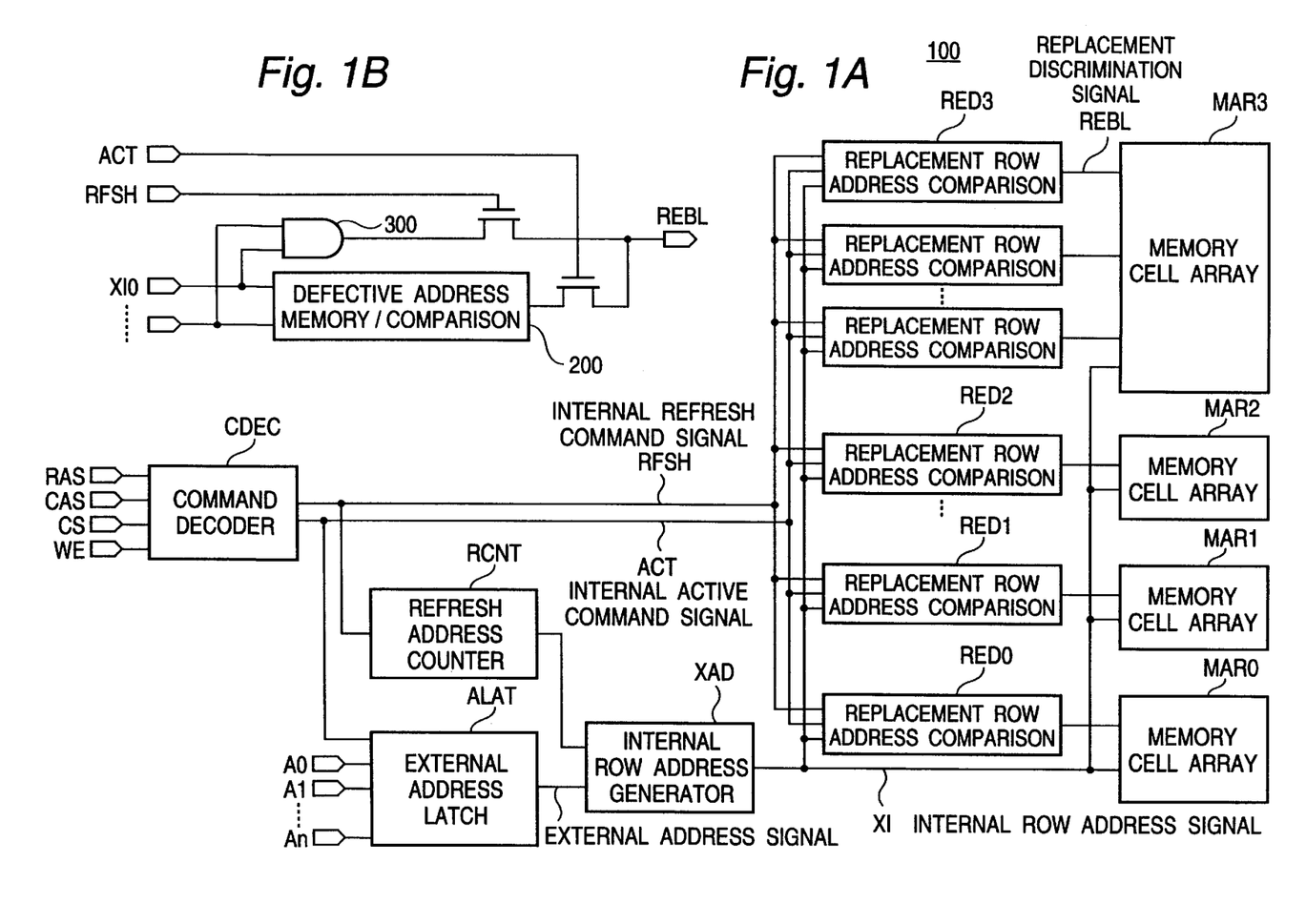
FIG. 1A is a block diagram illustrating the whole construction of one embodiment of the semiconductor memory in accordance with the present invention.
FIG. 1B is a block diagram illustrating a replacement address comparing circuit included in the semiconductor memory shown in FIG. 1A.

Referring to FIG. 1A, there is shown a block diagram illustrating the whole construction of one embodiment of the semiconductor memory in accordance with the present invention.

In FIG. 1A, the semiconductor memory is generally designated with Reference Numeral 100, and includes memory cell arrays MAR0 to MAR3 each including a plurality of memory cells, similarly to the prior art example shown in FIG. 5. Each of memory cell arrays MAR0 to MAR3 includes plurality of main word lines M00, M10, M01, M11, M02 M12, . . . , M07, M17) each of which is composed of a pair of sub-word lines S0000 and S1000 (S0010 and S1010, S0001 and S1001, S0011 and S1011, . . . ) each connected to a plurality of memory cells.

The semiconductor memory 100 also includes means XDn for driving the main word lines, and power supply voltage supply line driving means RAD00 and RAD10 connected to the sub-line lines.

The semiconductor memory 100 is so configured that, when a redundant word line used in place of a specific sub-word line including a defective sense amplifier is activated, the number of the sub-word lines activated when a data input/output is conducted is different from the number of sub-word lines activated in a refreshing operation, and that when the data input/output is conducted, a replacement of a sub-word line is executed on the basis of the result of a comparison between an externally supplied row address and an internally stored row address, and when the refreshing operation is conducted, the replacement of the sub-word line is executed on the basis of an output of an internal refresh address counter and simultaneously with an ordinary refreshing operation.

In order to overcome the above mentioned defect of the prior art, and to reduce a reduced consumption in the refresh operation and a chip area to elevate a defective cell replacement efficiency and a yield of production, the semiconductor memory 100 in accordance with the present invention is feature in that the number of the sub-word lines connected to the power supply voltage supplying line and activated when a data input/output is conducted is different from the number of sub-word lines connected to the power supply voltage supplying line and activated in a refreshing operation. In addition, when the data input/output is conducted, a discrimination signal is generated on the basis of the comparison between the externally supplied row address and the internally stored row address, and a redundant word line is driven on the basis of the discrimination signal. In the refresh operation, the sub-word line is driven on the basis of the output of an internal refresh row address counter.

More specifically, the semiconductor memory 100 in accordance with the present invention shown in FIG. 1 includes four memory cell arrays located in parallel to each other. When the data is inputted/outputted, the number of the activated sub-word line is ceaselessly one, however, when in the refreshing operation, the number of the activated sub-word line can be made two or more than two.

Therefore, the semiconductor memory 100 in accordance with the present invention is preferably a synchronous DRAM. Therefore, this synchronous DRAM is preferably so constructed that, when the refresh operation is conducted, an external row address is not used, and the refresh operation of the sub-word lines is executed in order in accordance with an internal address signal generated in a predetermined sequence.

Namely, in the semiconductor memory 100 in accordance with the present invention shown in FIG. 1, the external row address is used only when the data is inputted/outputted, and therefore, as a matter of course, the replacement of the sub-word line including the defective sense amplifier (called simply a "defective sub-word line" hereinafter) is conducted when a defective address comparing means for comparing the external row address with a previously set defective sub-word line address detects a coincidence, and a data reading/writing operation to be executed to the defective sub-word line is executed on a predetermined redundant sub-word line.

On the other hand, in the refresh operation, the comparing operation for comparing the external row address with the defective sub-word line address is in no way executed, and the refresh operation is executed in a predetermined order, as mentioned above.

Accordingly, in the semiconductor memory in accordance with the present invention, replacement row address comparing circuits RADn connected to the respective main word lines M00, M10, M01, M11, M02, M12, . . . , M07, ml7 in each of the memory cell arrays MAR0 to MAR3 is preferred to be constructed to output a replacement discrimination signal REBL on the basis of an internal active command signal ACT generated at the data inputting/outputting time, a refresh command signal RFSH and the internal row address signal XI.

Furthermore, the replacement row address comparing circuit RADn includes a defective address storing means for storing an address of the defective sub-word line, and a comparing means for comparing the stored defective sub-word line address with the internal row address.

In addition, in the semiconductor memory in accordance with the present invention, the replacement row address comparing circuit RADn can be constructed to execute the refresh operation for the sub-word line including the defective sense amplifier, when the sub-word line including the defective sense amplifier is selected. Alternatively, the replacement row address comparing circuit RADn can be constructed to generate a refresh operation stop signal, when the sub-word line including the defective sense amplifier is selected.

Namely, in the present invention, the replacement row address comparing circuit RADn is preferred not to execute the comparing and discriminating operation of the replacement row address in the refresh operation.

On the other hand, the replacement row address comparing circuit RADn is preferred to have a comparing means for comparing, in the refresh operation, the internal row address with the predetermined replacement address of the sub-word line to be replaced, namely, the information concerning the predetermined defective sub-word line is refreshed at what count. With this construction, when it reaches the predetermined count, it is possible either to execute the predetermined refresh operation or to stop the refresh operation. the semiconductor memory 100 in accordance with the present invention, only a refresh period and the number of refreshing in a CBR refreshing are defined concerning the refresh operation. Therefore, it is sufficient if the refresh commands of the prescribed refresh number are inputted in the prescribed refresh period. Accordingly, it is possible to internally freely set what number of sub-word lines are activated when the refresh command is inputted, so as to refresh memory cells connected to the sub-word lines activated.

Therefore, it is sufficient if the refresh operation is executed for the redundant sub-word lines used in place of the defective sub-word lines, when any refresh command is inputted in the refresh commands of the prescribed refresh number. Therefore, it is not necessary to execute the refresh operation on the row address signal generated internally.

On the other hand, when the active command is inputted, namely, when the data is inputted/outputted, the sub-word lines including the redundant sub-word lines used in place of the defective sub-word lines, are required to be selected on the basis of the externally supplied row address.

Accordingly, in the present invention, the activation of the redundant sub-word line is executed without intermediary of the replacement circuit when the refresh command is inputted, so that it is ensured that all the sub-word lines to be activated are connected to a predetermined RAI line. On the other hand, when the active command is inputted, the activation of desired sub-word lines including the redundant sub-word line is executed with intermediary of the replacement circuit.

In the following, the construction and the operation of the semiconductor memory 100 in accordance with the present invention will be described with the accompanying drawings. In the embodiment described hereinafter, the four memory cell arrays are located in parallel to each other, but it would be a matter of course to persons skilled in the art that the present invention is in no way limited to the embodiment described hereinafter, but can be applied to semiconductor memories having a plurality of memory cell arrays of the number other than four.

Namely, FIG. 1A is a block diagram illustrating the whole construction of one embodiment of the semiconductor memory 100 in accordance with the present invention, and FIG. 1B is a block diagram illustrating one example of the replacement address comparing circuit REDn included in the semiconductor memory shown in FIG. 1A.

Here, similarly to the prior art example, the number of the sub-word lines activated when the refresh command is inputted, is four times the number of the sub-word lines activated when the active command is inputted, are activated. However, it would be apparent that, if the ratio of the number of the sub-word lines activated when the refresh command is inputted, to the number of the sub-word lines activated when the active command is inputted, is two or more, it is included in the present invention.

The memory cell arrays MAR0 to MAR3 included in the shown embodiment include a plurality of memory cells, respectively, and are the same as those shown in FIG. 5.

In the shown embodiment, if the ratio of the number of the memory cells activated when the refresh command RFSH is inputted, to the number of the memory cells activated when the active command ACT is inputted, is four, the number of bits of the internal row address made effective when the refresh command is inputted is smaller than, by two bits, the bit number of the internal row address made effective when the active command is inputted, similarly to the prior art example. These two bits are used for activate, when the active command is inputted, one fourth of the main word lines activated when the refresh command is inputted.

In FIG. 1A, a command decoder CDEC receives various command signals RAS, CAS, CS and WE supplied from an external, and generates, on the basis of the combination of the external command signals, internal command signals for determining an internal operation. Of the internal command signals, only an internal active command signal ACT and an internal refresh command signal RFSH, which relate to the present invention, are shown in FIG. 1A.

The active command ACT is a command for selecting and activating the sub-word lines S000, S002, S004, S006, . . . in order to input data into a memory cell from an external or in order to output data in the memory cell to the external. The refresh command RFSH is a command for the rewriting (namely, refreshing) of the data of the memory cell.

In response to the internal active command signal ACT, an external address latch circuit ALAT fetches address signals A0 to An supplied from the external. A refresh address counter RCNT is a counter for holding a row address to be refreshed next, and updates the value of the counter in response to the internal refresh command signal RFSH.

In this embodiment, an internal row address generating circuit XAD generates an internal row address signal XI on the basis of on an output of the external address latch circuit ALAT when the active command ACT is inputted, and on the basis of the value of the refresh address counter RCNT when the refresh command RFSH is inputted.

When the ratio of the number of the memory cells activated when the refresh command RFSH is inputted, to the number of the memory cells activated when the active command ACT is inputted, is four, the number of bits of the internal row address made effective when the refresh command is inputted is smaller than, by two bits, the bit number of the internal row address made effective when the active command is inputted, similarly to the prior art example.

Referring to FIG. 1B which is a block diagram illustrating a replacement address comparing circuits RED0 to RED3, each of the replacement address comparing circuits RED0 to RED3 includes a defective address memory/comparing circuit 200 which is substantially the same as the replacement row address comparing circuit RED shown in FIG. 7 of the prior art example. In addition, since an output of the defective address memory/comparing circuit 200 is outputted as the replacement discrimination signal REBL through a switching transistor which is turned on in response to the active command ACT, the replacement operation is executed only when the active command ACT is inputted. This operation is substantially the same as the replacement row address comparing circuit RED shown in FIG. 7 of the prior art example. Namely, the defective address memory/comparing circuit 200 of the replacement address comparing circuits REDn stores the row address at which at least a portion of redundant sub-word lines RS000, RS100, RS001, RS101, RS002, RS102, . . . , RS007, RS107 is to be substituted, and compares with the stored row address with the internal row address.

When the result of comparison made indicates non-coincidence, the replacement discrimination signal REBL is inactivated, with the result that the main word line of the memory cell arrays MAR0 to MAR3 is activated on the basis of a portion of the internal row address signal XI. In addition, the RAI signal for selecting the power supply voltage supplying line driving circuit is selected on the basis of a portion of the internal row address signal XI. In this embodiment, the RAI signal for selecting the power supply voltage supplying line driving circuit can be constituted of the least significant bit of the internal row address signal XI.

On the other hand, when the result of comparison indicates coincidence, the replacement discrimination signal REBL is activated, with the result that the replacement is executed by activating any one of the redundant main word lines RM0, RM1, RM2, . . . , RM7. The power supply voltage supplying line driving signal RAI is selected on the basis of the replacement discrimination signal REBL, and is not necessarily coincident with the internal row address signal XI when the replacement is not executed. Accordingly, when the active command signal ACT is inputted, the operation including the replacement of the defective memory cell is similarly to that of the prior art example. On the other hand, when the refresh command RFSH is inputted, since the transistor receiving at its gate the active command signal ACT is turned off, the comparison and discrimination of the replacement row address is not outputted, namely, executed.

However, when the refresh command RFSH is inputted, information from a memory means for storing a count value indicative of the order in which the refresh operation should be executed, (namely, an inherent internal row address of the redundant main word lines) is compared with the internal row address by an AND gate provided in each replacement address comparing circuit REDn. When both are coincident, an output of the AND gate 300 is outputted as the replacement discrimination signal REBL through a switching transistor which is turned on in response to the refresh command RFSH. At this time, the main word lines of the number which is four times the number of the main word line(s)

activated when the active command ACT is inputted, for example, M00, M02, M04, M06, are activated. However, M04, M06 are not shown in FIG. 5 for simplification of the drawing.

As mentioned above, the power supply voltage supplying lines, for example, RAI00, RAI01, are driven in accordance with the internal row address of the refresh address counter TCNT.

With this operation, SWD000, SWD002, SWD004, SWD006 are simultaneously selected to receive the power supply voltage from the power supply voltage supplying line RAI00 so that the sub-word lines S000, S002, S004, S006 are activated. Thus, the memory cells are rewritten (namely, refreshed) by the sense amplifiers SA connected to the activated sub-word lines. SWD004, SWD006 are not shown in FIG. 5 for simplification of the drawing.

When a next refresh command RFSH is inputted, since a different internal row address is generated, for example, the sub-word lines S100, S102, S104, S106 are activated.

By repeating the above mentioned operation, if the refresh commands of the predetermined refreshing number have been inputted, the memory cells connected to all the sub-word lines are rewritten (namely, refreshed). Incidentally, the refreshing number at this time is called the refresh cycle.

On the other hand, the redundant main word lines RM0, RM1, RAM2, . . . , RM7 are activated when the refresh address counter RCNT generates a row address XAD corresponding to the inherent internal row address XI of the redundant main word lines RM0, RM1, RAM2, . . . , RM7.

For example, in FIG. 5, the redundant main word line RM1 is activated together with the main word lines M00, M02, M04, M06, so that a redundant sub-word line driver circuit RS001 is activated together with the sub-word line driver circuits SWD000, SWD002, SWD004, SWD006, and therefore, the redundant memory cells connected to the redundant sub-word line driver circuit RS001 are rewritten (namely, refreshed).

At this time, the load of the power supply voltage supplying line driver circuit RAD00 increases, but since the capacitive load of the redundant sub-word line driver circuit RS001n is smaller than the total amount of the power supply voltage supplying line RAI00 and the sub-word lines S000, S002, S004, S006, the increase of the load of the power supply voltage supplying line driver circuit RAD00 does not become a problem.

In addition, in an ordinary case, since the number of the redundant sub-word lines operating independent of each other is smaller than the number of the refresh cycles, the redundant sub-word lines are not activated for all the refresh commands, and therefore, considering at the average of the refreshing operations, the current consumption is further decreased.

In the present invention, the number of the power supply voltage supplying lines RAI driven when the refresh command RFSH is inputted, is the same number as that when the active command ACT is inputted. Therefore, the charging/discharging current of the power supply voltage supplying lines RAI does not increase.

In addition, when the refresh command RFSH is inputted, no comparison of the replacement row address is executed, and therefore, the replacement efficiency is determined by the sub-word line replacement when the active command ACT is inputted, with the result that the replacement efficiency does not lower in comparison with the prior art example.

As mentioned above, when the active command ACT is inputted, the operation is performed similarly to the prior art example, so that the current consumption and the defective replacement efficiency do not become deteriorated, and when the refresh command RFSH is inputted, the operation of the power supply voltage supplying lines RAI is performed similarly to that when the active command ACT is inputted, so that the consumed current can be reduced.

In the embodiment mentioned above, it has been described that all the sub-word lines activated when the refresh command RFSH is inputted, are included in a single memory cell array. However, even if the sub-word lines activated when the refresh command RFSH is inputted, are included in two or more memory cell arrays, the present invention is more advantageous than the prior art example, if the number of the sub-word lines provided for one memory cell array is increased.

Figures 2A, 2B:
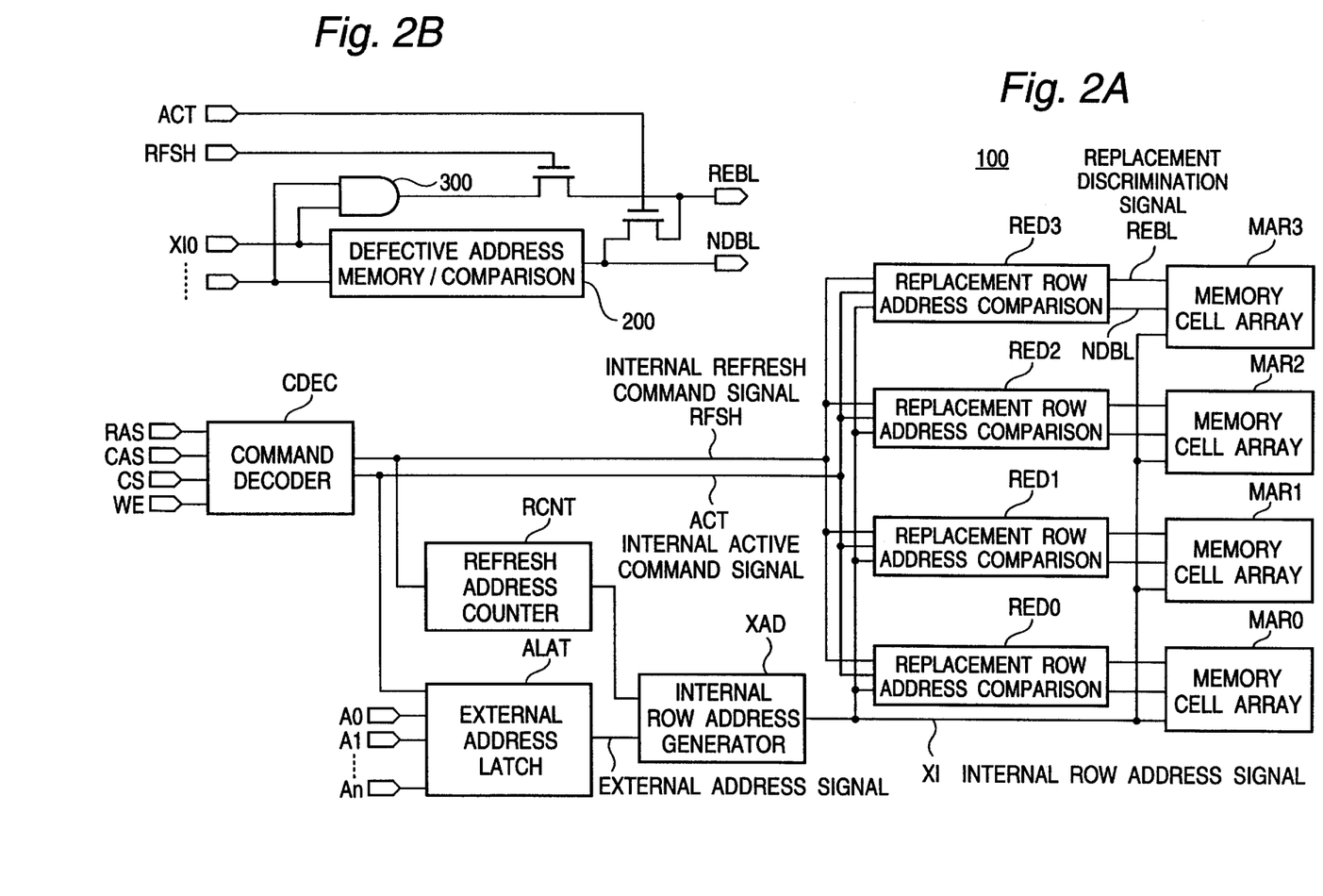
FIG. 2A is a block diagram illustrating the whole construction of another embodiment of the semiconductor memory in accordance with the present invention.
FIG. 2B is a block diagram illustrating a replacement address comparing circuit included in the semiconductor memory shown in FIG. 2A.
Figure 3:
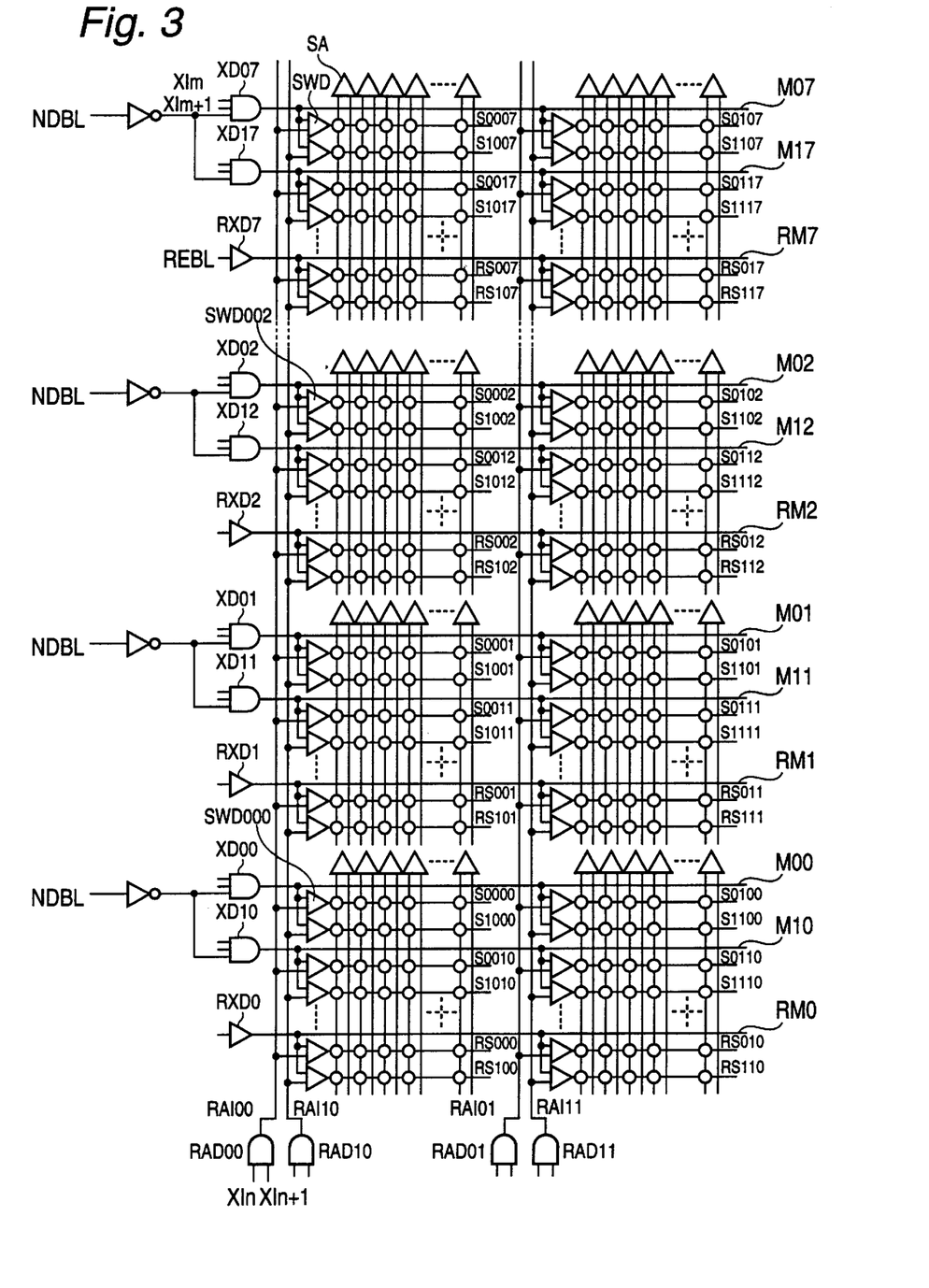
FIG. 3 is a block diagram illustrating the construction of the memory cell arrays MAR0 to MAR 3 shown in FIG. 2A.

Now, another embodiment of the semiconductor memory in accordance with the present invention will be described with reference to FIG. 2A and FIG. 2B. FIG. 2A is a block diagram illustrating the whole construction of another embodiment of the semiconductor memory in accordance with the present invention, and FIG. 2B is a block diagram illustrating a replacement address comparing circuit RED included in the semiconductor memory shown in FIG. 2A. FIG. 3 is a block diagram illustrating the construction of the memory cell arrays MAR0 to MAR 3 shown in FIG. 2A. In FIG. 3, elements corresponding to those shown in FIG. 5 are given the same Reference Numerals, and explanation thereof will be omitted.

In the first embodiment, when the sub-word line including the defective memory cell is activated in the refreshing operation. Therefore, when the defective memory cell short-circuits between word lines, if the sub-word line connected to the defective memory cell is activated, an unnecessary current flows, so that there is possibility that it becomes a current defective.

For this purpose, when the refresh command RFSH is inputted in this second embodiment, the redundant main word line RMn is selected similarly to the first embodiment, but the replacement address comparing circuit REDn compares the internally stored replacement row address with the internal row address.

When the result of comparison indicates coincidence, a signal NDBL for stopping the refresh operation is activated. For this purpose, as shown in FIG. 2B, the output of the defective address memory/comparing circuit 200 is outputted as the signal NDBL, which is supplied to the corresponding memory cell array MAR0 to MAR3. As seen from comparison between FIG. 1B and FIG. 2B, the replacement address comparing circuits REDn of the second embodiment is the same as the replacement address comparing circuits REDn of the first embodiment, excepting that the output of the defective address memory/comparing circuit 200 is outputted as the signal NDBL.

Referring to FIG. 3 which is a block diagram illustrating the construction of the memory cell arrays MAR0 to MAR 3 shown in FIG. 2A, the refresh operation stopping signal NDBL is supplied through an inverter to the main word line decoder XD00 to XD17, so that the main word line selected by the internal row address signal XI is forcibly deactivated by the refresh operation stopping signal NDBL. Therefore, the sub-word lines connected to the main word line which is selected by the internal row address signal XI but is forcibly deactivated by the refresh operation stopping signal NDBL, are not correspondingly activated.

Accordingly, in the second embodiment, the increase of the current consumption caused by the charging/discharging of the power supply voltage supplying line driving circuit RAI and the lowering of the yield of production caused by the drop of the replacement efficiency, can be avoided, similarly to the first embodiment. In addition, since the current defective can be reduced, the yield of production can be further elevated.

The invention has thus been shown and described with reference to the specific embodiments. However, it should be noted that the present invention is in no way limited to the details of the illustrated structures but changes and modifications may be made within the scope of the appended claims.

For example, the semiconductor memory 100 in accordance with the present invention can have the following modifications:

The semiconductor memory 100 can comprise a plurality of main word lines selected and activated by a first external row address signal supplied from an external for mainly driving the main word lines, for example, an output of the external address latch ALAT, or a first internal row address signal, for example XAD generated internally in the semiconductor memory, a plurality of power supply voltage supplying lines selected and activated by a second external row address signal RA, RAI supplied from an external for mainly selectively driving the power supply voltage line driving circuits, or a second internal row address signal generated internally in the semiconductor memory, a plurality of sub-word lines connected to a gate electrode of a plurality of memory cells and selected and activated by the main word line and the power supply voltage supplying lines, means for activating the sub-word lines for being ready to read or write a memory cell data in response to a first command, for example, an internal active command, means for activating the sub-word lines for being ready to rewrite a memory cell data in response to a second command, for example, an internal refresh command, the number of the sub-word lines included in the sub-word lines connected to the power supply voltage supplying line and activated by the first external row address signal being different from the number of the sub-word lines activated by the second external row address signal.

In this modification, the second external row address signal is an address used for selecting the power supply voltage supplying line driving circuit RAD in order to select the sub-word lines, and can be correspond to for example the least significant bit of the internal row address. In this case, the first external row address signal is the internal row address excluding the least significant bit.

Furthermore, the semiconductor memory 100 in accordance with the present invention is preferred to have a redundant main word line and redundant sub-word lines connected to the redundant main word line. In addition, as shown in FIG. 7, the semiconductor memory 100 in accordance with the present invention is also preferred to include the means for storing the row address of the defective memory cell and a first discriminating means REDn for comparing the row address of the defective memory cell with the internal row address to generate a first discrimination signal, for example, the replacement discrimination signal REBL.

Moreover, the semiconductor memory 100 in accordance with the present invention is preferred to have means RXDn for activating the redundant main word line on the basis of the first discrimination signal. In addition, the semiconductor memory 100 in accordance with the present invention is also preferred to have means RAD for selecting and activating the power supply voltage supplying line RA on the basis of the first discrimination signal REBL.

Still further, the semiconductor memory 100 in accordance with the present invention is preferred to have a second discriminating circuit 300 for comparing the respective inherent row address with the internal row address so as to generate a second discrimination signal.

This second discriminating circuit 300 compares the internal row address with the count value determining the order of the refresh operation when the refresh operation is to be executed, and outputs the replacement discrimination signal REBL when the result of comparison indicates coincidence. When the result of comparison indicates coincidence, the refresh operation for the corresponding redundant sub-word line is executed.

On the other hand, when the first command is inputted, the main word line or the redundant main word line is selected and activated on the basis of the internal row address signal and the first discrimination signal, and also, the power supply voltage supply line is selected and activated on the basis of the internal row address signal and the first discrimination signal. When the second command is inputted, the main word line and the power supply voltage supply line are selected and activated on the basis of the internal row address signal, and the redundant main word line is selected and activated on the basis of the second discrimination signal.

In this arrangement, there is further provided a means for inactivating the main word line on the basis of the internal row address signal and the first discrimination signal, when the second command indicative of the refresh operation is inputted. Therefore, a wasteful refresh operation is not executed, and only the replaced redundant sub-word line is refreshed.

Thus, the semiconductor memory and the semiconductor memory driving method in accordance with the present invention can realize a semiconductor memory having a reduced current consumption in the refresh operation, a reduced chip area, a high defective cell replacement efficiency and a high yield of production.

What is claimed is:

1. A semiconductor memory including a plurality of memory cell arrays each composed of a plurality of memory cells, each of said memory cell arrays including a plurality of main word lines, each of which is composed of a pair of sub-word lines each connected to said plurality of memory cells, means for driving said main word lines, power supply-voltage supply line driving means connected to said sub-word lines, wherein the number of said sub-word lines activated when a data input/output is conducted is different from the number of sub-word lines activated in a refreshing operation, and wherein in the case that a redundant word line used in place of a specific sub-word line including a defective memory cell is activated, when the data input/output is conducted, a redundant sub-word line is activated on the basis of the result of a comparison between an externally supplied row address and an internally stored row address, and when the refreshing operation is conducted, said redundant sub-word line is activated on the basis of an output of an internal refresh address counter at the same time as not-redundant sub-word lines are activated.

2. The semiconductor memory according to claim 1, wherein the semiconductor memory is a synchronous dynamic random access memory.

3. The semiconductor memory according to claim 2, wherein the refreshing operation is executed on the basis of only an internal address.

4. The semiconductor memory according to claim 1, further including a replacement address comparing means provided for each of said memory cell rays, to generate a replacement discrimination signal on the basis of an internal active command generated when data is inputted/outputted, a refresh command signal and an internal row address signal.

5. The semiconductor memory according to claim 4, wherein said replacement address comparing means includes a defective address storing means for storing a defective address concerning the sub-word line, and a comparing means for comparing said stored defective address with said internal row address signal.

6. The semiconductor memory according to claim 5, wherein said replacement address comparing means is so configured to output a refresh operation stopping signal for stopping the refreshing operation for a sub-word line including a defective sense amplifier when the sub-word line including the defective sense amplifier is selected.

7. The semiconductor memory according to claim 4, wherein said replacement address comparing means does not execute the comparison of the replacement row address in the refreshing operation.

8. The semiconductor memory according to claim 4, wherein said replacement address comparing means includes a comparing means for comparing said internal row address with a predetermined replacement address concerning the redundant sub-word line performing the replacement operation in the refreshing operation.

9. A method for driving a semiconductor memory including a plurality of memory cell arrays each composed of a plurality of memory cells, each of said memory cell arrays including a plurality of main word lines, each of which is composed of a pair of sub-word lines each connected to said plurality of memory cells, means for driving said main word lines, power supply-voltage supply line driving means connected to said sub-lines, wherein the number of said sub-word lines activated when a data input/output is conducted is different from the number of sub-word lines activated in a refreshing operation, the method including driving the semiconductor memory in such a manner that in the case that a redundant word line used in place of a specific sub-word line including a defective memory cell is activated, when the data input/output is conducted, a redundant sub-word line is activated on the basis of the result of a comparison between an externally supplied row address and an internally stored row address, and when the refreshing operation is conducted, said redundant sub-word line is activated on the basis of an output of an internal refresh address counter at the same time as not-redundant sub-word lines are activated.

10. The method according to claim 9, wherein the semiconductor memory is a synchronous dynamic random access memory.

11. The method according to claim 10, wherein the refreshing operation is executed on the basis of only an internal address.

12. The method according to claim 9, wherein by a replacement address comparing means provided for each of said memory cell arrays, a replacement discrimination signal is generated on the basis of an internal active command generated when data is inputted/outputted, a refresh command signal and an internal row address signal.

13. The method according to claim 12, wherein said replacement address comparing means includes a defective address storing means for storing a defective address concerning the sub-word line, and a comparing means for comparing said stored defective address with said internal row address signal.

14. The method according to claim 13, wherein said replacement address comparing means is so configured to output a refresh operation stopping signal for stopping the refresh operation for a sub-word line including a defective sense amplifier when the sub-word line including the defective sense amplifier is selected.

15. The method according to claim 12, wherein said replacement address comparing means does not execute the comparison of the replacement row address in the refreshing operation.

16. The method according to claim 12, wherein said replacement address comparing means includes a comparing means for comparing said internal row address with a predetermined replacement address concerning the redundant sub-word line performing the replacement operation in the refreshing operation.

* * * * *